US012571088B2

(12) United States Patent
Burtner et al.

(10) Patent No.: US 12,571,088 B2
(45) Date of Patent: Mar. 10, 2026

(54) HIGH INCIDENCE ANGLE GRAPHITE FOR PARTICLE CONTROL WITH DEDICATED LOW SPUTTER YIELD ION BEAM

(71) Applicant: Axcelis Technologies, Inc., Beverly, MA (US)

(72) Inventors: David M. Burtner, Belmont, MA (US); Neil J. Bassom, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 530 days.

(21) Appl. No.: 18/084,705

(22) Filed: Dec. 20, 2022

(65) Prior Publication Data

US 2023/0235449 A1     Jul. 27, 2023

Related U.S. Application Data

(60) Provisional application No. 63/301,641, filed on Jan. 21, 2022.

(51) Int. Cl.
*C23C 14/48* (2006.01)
*C23C 14/06* (2006.01)
*H01J 37/317* (2006.01)

(52) U.S. Cl.
CPC .......... *C23C 14/48* (2013.01); *C23C 14/0605* (2013.01); *H01J 37/3171* (2013.01);
(Continued)

(58) Field of Classification Search
CPC ..... C23C 14/48; C23C 14/0605; C23C 14/06; H01J 37/3171; H01J 2237/022; H01J 2237/31705
(Continued)

(56) References Cited

U.S. PATENT DOCUMENTS 7,358,508 B2     4/2008  Ring et al.
8,963,107 B2 *   2/2015  Eisner .................. H01J 37/147
                                                       250/492.3
(Continued)

FOREIGN PATENT DOCUMENTS

JP          H08220298 A   *   8/1996   ............... G21K 1/10

OTHER PUBLICATIONS

Csato Constantin et al. "Energy filter for tailoring depth profiles in semiconductor doping application", Nuclear Instruments and Methods in Physics Research. Section B: Beam Interactions with Materials and Atoms, vol. 365, Dec. 15, 2015, pp. 182-186, XP029313812, ISSN: 0168-583X.
(Continued)

*Primary Examiner* — Parviz Hassanzadeh
(74) *Attorney, Agent, or Firm* — Eschweiler & Potashnik, LLC

(57)     ABSTRACT

An ion source for an ion implantation system is configured to form an ion beam from a predetermined species along a beamline, where the ion beam is at an initial energy. A deceleration component is configured to decelerate the ion beam to a final energy that is less than the initial energy. A workpiece support is configured to support a workpiece along a workpiece plane downstream of the deceleration component along the beamline. A beamline component is positioned downstream of the deceleration component along the beamline. The beamline component has a feature that is at least partially impinged by the ion beam, and where the feature has a surface having a predetermined angle of incidence with respect to the ion beam. The predetermined angle of incidence provides a predetermined sputter yield of the ion beam at the final energy that mitigates deposition of the ion species on the beamline component.

20 Claims, 7 Drawing Sheets

(52) U.S. Cl.
CPC .................... *H01J 2237/022* (2013.01); *H01J*
*2237/31705* (2013.01)

(58) Field of Classification Search
USPC ...................................................... 118/723 R
See application file for complete search history.

(56)                    References Cited

U.S. PATENT DOCUMENTS

| | | | |
|---|---|---|---|
| 10,037,877 B1 | 7/2018 | Vanderberg et al. | |
| 10,689,752 B2 | 6/2020 | Kirkwood et al. | |
| 2002/0050573 A1 | 5/2002 | Suguro et al. | |
| 2012/0001087 A1 | 1/2012 | Radovanov et al. | |
| 2015/0001391 A1* | 1/2015 | Blake ...................... | C23C 14/22 |
| | | | 250/288 |
| 2017/0059997 A1 | 3/2017 | Rupp et al. | |
| 2019/0144991 A1* | 5/2019 | Kirkwood ............... | C23C 14/48 |
| | | | 118/715 |
| 2022/0020556 A1 | 1/2022 | Krippendorf et al. | |

OTHER PUBLICATIONS

International Search Report dated Mar. 30, 2023 in connection with PCT/US2022/053488.

* cited by examiner

230

| Target Species | Mean Ion Range (nm) | Sputter Yield (atom/ion) |
|---|---|---|
| Carbon | 10.6 | 0.33 |
| Boron | 10.7 | 0.37 |

PROVIDE STARTING
SUBSTRATE — 302

TEXTURE ONE OR MORE
SURFACE REGIONS OF
COMPONENT TO DEFINE
SPUTTER YIELD >1 — 304

— 300

1

HIGH INCIDENCE ANGLE GRAPHITE FOR PARTICLE CONTROL WITH DEDICATED LOW SPUTTER YIELD ION BEAM

REFERENCE TO RELATED APPLICATIONS

This application claims the benefit of U.S. Provisional Application Ser. No. 63/301,641 filed Jan. 21, 2022, entitled, "HIGH INCIDENCE ANGLE GRAPHITE FOR PARTICLE CONTROL WITH DEDICATED LOW SPUTTER YIELD ION BEAM", the contents of which are herein incorporated by reference in their entirety.

FIELD

The present invention relates generally to ion implantation systems, and more specifically to systems, apparatuses, and methods for enhancing removal of atomic films and increasing sputter yields in an ion implantation system.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such treatment with an ion beam is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the wafer to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device supporting the wafer along a wafer plane. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Reducing particle generation in semiconductor processing equipment is an area of constant focus. In particular, particle levels can rise following extended low energy boron (B) or carbon (C) operation. Such low energy implants are increasingly of interest in semiconductor processing. One cause of such particles is the gradual coating of surfaces of the implanter which are frequently or continuously struck by the beam and subsequent delamination of the resulting films when they exceed a certain thickness (e.g., on the order of several microns). Such films can be deposited at rates approximately 1 μm per day. For example, at the low energies (e.g., less than 10 keV) required for some modern devices, the sputter yield of incoming ions (e.g., the number of atoms ejected from the film for each incoming ion) is significantly less than 1.0, and as such, the ion beam does little to slow growth of the film.

FIG. 1, for example, illustrates an SEM image 10 showing a cross section 12 of a conventional beamline component 14 that is struck by a low energy ion beam 16, whereby a thin film 18 has been formed or deposited over time on a surface 20 of the beamline component. The thin film 18 formed on the beamline component 14, for example, may be generated through back-sputtering of coatings on a workpiece (not shown) downstream of the beamline component, or from the workpiece, itself, as well as from graphite forming some of the beamline components, whereby the thin film may be heavily doped with the implant species. In particular, a low energy (e.g., approx. 3 KeV) ion beam 16 comprising boron (B) or carbon (C) can be particularly problematic in conventional systems, as boron and carbon atoms tend to coat surfaces when struck at such low energies.

Delamination of the thin film 18 may occur when stresses associated with the bond between the thin film and the beamline component 14 grows beyond a critical level, whereby the thin film has a tendency to flake off the beamline component and subsequently contaminate the workpiece. The delamination of the thin film can be further accelerated in a beamline component 14 that is in close proximity to the ion beam 16 and at least partially impinged by the ion beam, whereby the ion beam may cause thermal cycling between the beamline component and the thin film, thus increasing a likelihood of increased stresses. For example, thermal cycling associated with heating and cooling of the thin film 18 and underlying beamline component 14 may lead to differences in thermal expansion, which, in turn, can lead to delamination of the thin film from the beamline component. Again, such delamination of the thin film 18 can lead to deleterious contamination of the workpiece.

SUMMARY

The present disclosure is directed generally toward systems and methods for ion implantation including various beamline components having modified surfaces configured for minimizing formation of films and/or cleaning of films formed on the beamline components. Thus, the present disclosure provides a system, apparatus, and method for enhancing removal of films and increasing sputter yields in an ion implantation system. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one example aspect, an ion implantation system comprising an ion source, wherein the ion source is configured to form an ion beam from a predetermined species, such as boron or carbon, along a beamline. The ion beam, for example, is formed by the ion source at an initial energy. A deceleration component is provided along the beamline, wherein the deceleration component is configured to decelerate the ion beam to a final energy that is less than the initial energy. A workpiece support is provided along the beamline downstream of the deceleration component, wherein the workpiece support is configured to support a workpiece along a workpiece plane. A beamline component is further positioned downstream of the deceleration component along the beamline, wherein the beamline component comprises a feature that is at least partially impinged by the ion beam. The feature, for example, comprises a surface having a predetermined angle of incidence with respect to the ion beam such that the surface has a predetermined sputter yield of the ion beam at the final energy, and wherein deposition of the ion species on the beamline component is generally mitigated.

In accordance with one example aspect of the disclosure, an ion implantation system is provided, wherein an ion source is configured to form an ion beam at an initial energy from a predetermined species, wherein the ion beam defines a beam path. The predetermined species, for example, comprises one of boron or carbon. A deceleration component, for example, is positioned along the beam path and configured to decelerate the ion beam to a final energy that is less than the initial energy. A workpiece support, for example, is further configured to support a workpiece along the beam path downstream of the deceleration component, and a beamline component is positioned downstream of the deceleration component along the beam path. The beamline component, for example, defines an aperture configured to pass at least a portion of the ion beam therethrough. The beamline component, for example, comprises an upstream-facing surface that is non-parallel to the beam path proximate to the aperture, wherein the upstream-facing surface comprises a plurality of features that are at least partially impinged by the ion beam. Each of the plurality of features, for example, comprises a feature surface having a predetermined angle of incidence with respect to the beam path to define a predetermined sputter yield of the ion beam at the final energy, wherein the predetermined sputter yield generally mitigates a deposition of the predetermined species on the beamline component.

The predetermined sputter yield, for example, is defined by a ratio of a number of atoms of the predetermined species sputtered from the upstream-facing surface to a number of ions of the predetermined species impinging the upstream-facing surface. In one example, the predetermined sputter yield is preferably greater than one. The predetermined angle of incidence, for example, can be between approximately 45 degrees and approximately 80 degrees.

In one example, the plurality of features define a plurality of V-shaped grooves. The plurality of V-shaped grooves, for example, have a predetermined depth when viewed along the beam path. The predetermined depth, in one example, is between approximately 2 mm and approximately 6 mm, and the final energy is approximately 3 KeV.

In another example, the beamline component is comprised of carbon, and can comprise one or more of an E-slit, a front plate associated with a dose cup, a tunnel exit, and a beam tuning cup.

In accordance with another example aspect of the disclosure, an ion implantation system is provided having an ion source configured to define an ion beam at an initial energy from a predetermined species comprising boron or carbon along a beam path. An energy component is configured to define a predetermined energy of the ion beam along the beam path, wherein the predetermined energy is less that the initial energy. A beamline component, for example, is further positioned downstream of the energy component along the beam path, wherein the beamline component has an upstream-facing surface that is at least partially impinged by the ion beam and is non-parallel to the beam path. The upstream-facing surface, for example, comprises a plurality of features configured to define a sputter yield of greater than one, wherein the sputter yield is defined by a ratio of a number of atoms of the predetermined species that are sputtered from the upstream-facing surface to a number of ions of the predetermined species impinging the upstream-facing surface. Each of the plurality of features, for example, respectively comprises a feature surface defining a predetermined angle of incidence between the feature surface and ion beam when measured along the beam path, wherein the predetermined angle of incidence is less than 90 degrees.

In yet another example aspect, an ion implantation system is provided comprising a source species comprising one of boron or carbon. An ion source, for example, is configured to form an ion beam along a beam path at an initial energy from the source species. An energy component, for example, is positioned downstream of the ion source along the beam path and configured to define a predetermined energy of the ion beam, wherein the predetermined energy is less that the initial energy.

A beamline component, for example, is provided and positioned downstream of the energy component along the beam path, wherein the beamline component has an upstream-facing surface that is at least partially impinged by the ion beam and is non-parallel to the beam path. The upstream-facing surface, for example, comprises a plurality of features configured to define a sputter yield of greater than one. In one example, each of the plurality of features respectively comprises a feature surface defining a predetermined angle of incidence between the feature surface and ion beam when measured along the beam path, wherein the predetermined angle of incidence is less than 90 degrees.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
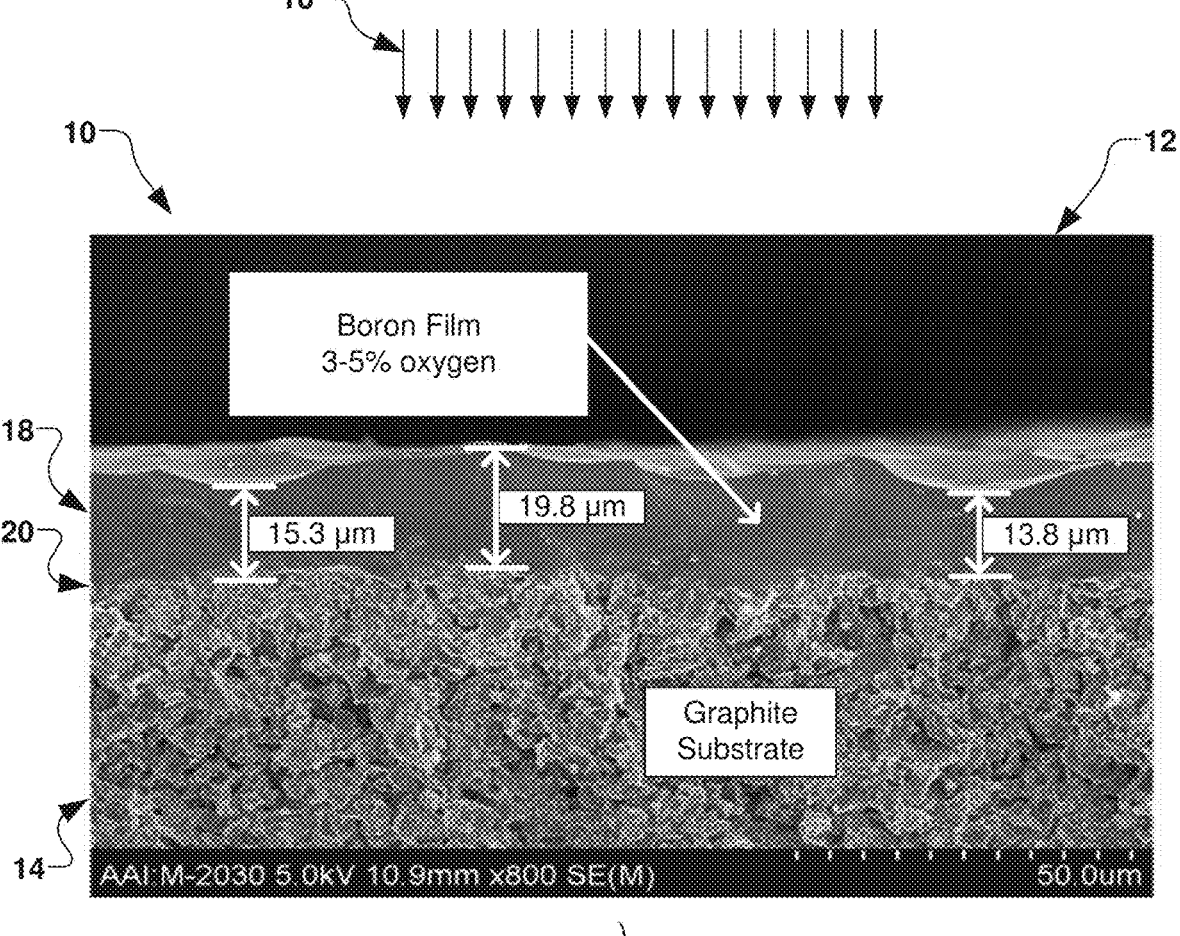
FIG. 1 is an SEM photo of an example of a deposition of boron atoms on a conventional beamline component.

The present disclosure is directed generally toward systems and methods for ion implantation including various beamline components having modified surfaces configured for minimizing formation of films and/or cleaning of films formed on the beamline components. More particularly, the present disclosure is directed toward systems, apparatuses, and methods for prevention, stabilization and/or removal of films formed on beamline components in an environment near a workpiece being implanted with a low energy ion beam, whereby a modification of one or more surfaces of the beamline components aids in the prevention, stabilization and/or removal of said films. In particular, the beamline components may comprise beamline components in a post-deceleration region of the ion implantation system, such as a dose cup, exit aperture, tunnel walls, etc., in a near-wafer environment proximate to a workpiece region of a beamline of the ion implantation system, where the ion beam is at a final energy.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various beamline components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features, circuits, or elements in one embodiment, and may also or alternatively be fully or partially implemented in a common feature, circuit, or element in another embodiment. For example, several functional blocks may be implemented utilizing a common feature, circuit, or element. It is further to be understood that any connection which is described as being wire-based in the following specification may also be implemented as a wireless communication, unless noted to the contrary.

Figure 2:
FIG. 2 is a block diagram of an exemplary vacuum system in accordance with various aspects of the present disclosure.

Referring now to the figures, in order to gain a better understanding of the invention, and in accordance with one aspect of the present disclosure, FIG. 2 illustrates an exemplary ion implantation system 100. The ion implantation system 100, for example, comprises a terminal 102, a beamline assembly 104, and an end station 106. Generally speaking, an ion source 108 in the terminal 102 is coupled to a power supply 110 to ionize a dopant gas into a plurality of ions and to form an ion beam 112 at an initial energy and generally define a beam path 113. The ion beam 112 in the present example is directed along the beam path 113 through a mass analyzer 114, and out an aperture 116 towards the end station 106. In the end station 106, the ion beam 112 impacts a workpiece 118 (e.g., a semiconductor workpiece such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure. In a preferred embodiment, the ion beam 112 comprises a spot beam, wherein the spot beam is scanned via a beam scanner 122 positioned downstream of the aperture 116. The beam scanner 122, for example, electrostatically or magnetically scans the ion beam 112 along a first axis 123 (e.g., in the x-direction), wherein a plurality of beamlets of the ion beam can be further parallelized downstream of the beam scanner via a parallelizer 124. Furthermore, a workpiece scanner 126 can be utilized to scan the workpiece through the ion beam 112 (e.g., the workpiece 118 is mechanically scanned in the y-direction).

One or more of an angular energy filter (AEF) 128 and a deceleration component 130 may be further provided in the ion implantation system 100. The AEF 128, for example, may comprise one or more features provided in the Purion Ion Implantation System manufactured by Axcelis Technologies, Inc. of Beverly, MA. The AEF 128, for example, is configured to receive the scanned and parallel ion beam 112 and subsequently deflect the ion beam from an incoming beamline axis along a second axis (e.g., in the vertical or y-direction). The deceleration component 130, for example, is configured to decelerate the ion beam 112 to a final energy that is less than the initial energy provided to the ion beam 112 from the ion source 108.

Furthermore, a controller 132 is provided and operable to control some or all of the ion implantation system 100, such as the ion source 108, AEF 128, deceleration component 130, beam scanner 122, and/or various other components of the system based on the implantation desired. A vacuum source 134 (e.g., a vacuum pump) is further provided for evacuating the system 100.

The present disclosure appreciates that particulate contamination in the ion implantation system 100 may deleteriously affect the workpiece 118, whereby the contamination may alter the desired characteristics of the workpiece. One of the primary sources of particulate contamination in the ion implantation system 100 arises from a delamination of thin films that may be formed on one or more beamline components 136 in a so-called near-wafer environment (NWE) 138 proximate to the workpiece 118. For example, the one or more beamline components 136 may comprise various components typically provided in the near-wafer environment 138, such as a front plate associated with a dose cup for measuring ion dose, an exit aperture of a beam tunnel upstream of the workpiece 118, an E-slit, a tuning faraday cup for tuning the ion beam 112, or any other components downstream of the deceleration component 130 that may be sources of particular contamination.

In particular, the one or more beamline components 136, for example, are downstream of the AEF 128 and/or the deceleration component 130, whereby the ion beam 112 is at the final energy when encountering the one or more beamline components. In one example, the near wafer environment 138 may be anywhere from the last energized beamline electrodes (e.g., the AEF 128 or deceleration components 130) to a substrate plane 140 (e.g., called a drift region or field free region). Absent countermeasures, such beamline components 136 may rapidly become prone to film delamination through interaction with the ion beam 112. The near-wafer environment 138, for example, may be a location within approximately 10 cm of the substrate plane 140 of the workpiece 118.

The thin films on the beamline components 136, for example, may be generated through back-sputtering of coatings (not shown) on the workpiece 118 or the workpiece, itself, as well as from graphite forming some of the beamline components 136 in the vacuum system, whereby the thin films are heavily doped with the implant species. In particular, a low final energy (e.g., approx. 3 KeV) ion beam 112 comprising boron (B) or carbon (C) can be particularly problematic in conventional systems, as boron and carbon atoms tend to coat surfaces when struck at such low energies. Delamination of the thin films may occur when the stresses associated with the bond between the thin films and the beamline components 136 grows beyond a critical level, whereby the thin films have a tendency to flake off the beamline components and contaminate the workpiece 118. The delamination of the thin films can be accelerated when in close proximity to the ion beam 112, whereby the ion beam may cause thermal cycling between the beamline component 136 and the thin film, thus increasing a likelihood of increasing the stresses. For example, thermal cycling associated with heating and cooling of the films and underlying beamline components 136 may lead to differences in thermal expansion, which, in turn, can lead to film delamination from the beamline components.

Thus, in accordance with one exemplary aspect of the disclosure, the one or more beamline components 136 of the present disclosure may comprise a modified graphite configured to protect the beamline components, and wherein beamline components such as graphite liners may be textured in locations where impingement from the ion beam 112 at low energies associated with boron or carbon implants is experienced, such that impingement from the ion beam advantageously sputters atoms that may have become attached to the surface of the one or more beamline components, as will be discussed in greater detail, infra. The present disclosure appreciates that beamline components 136 made of a particular material (e.g., virgin, unadulterated graphite) may have a propensity to shed small particles when exposed to the ion beam 112. Such particle shedding is a concern and increasingly problematic when smaller and smaller particle sizes are present in the near wafer environment 138. Film delamination in the near wafer environment 138 is a primary source of particle excursions that may be caused by back-sputtered material coating the liners or other surfaces in the near wafer environment, and may further cause subsequent delamination through film stress or thermal cycling.

Figure 3:
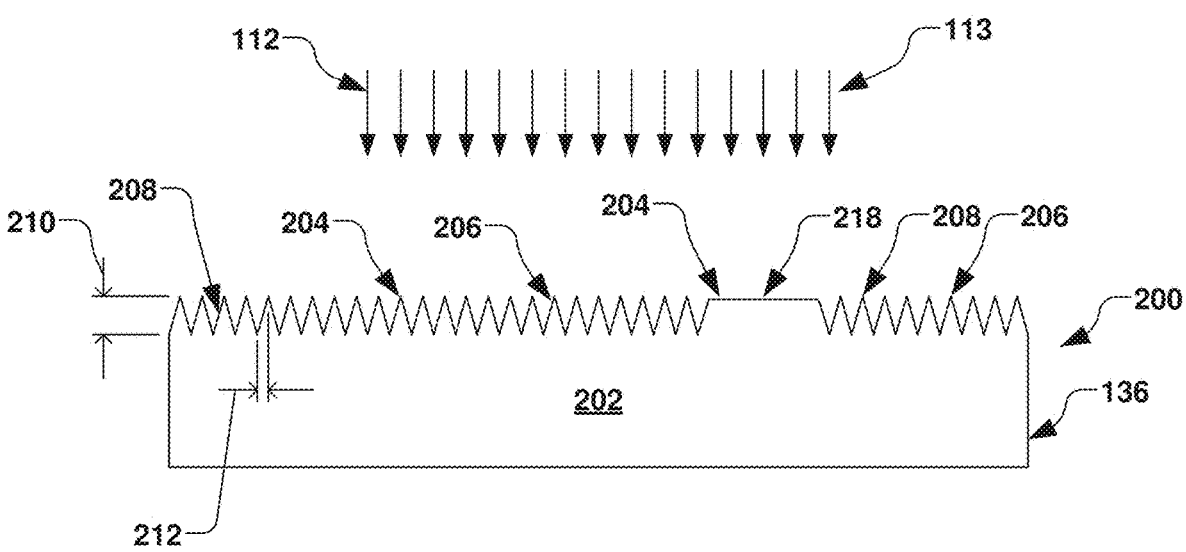
FIG. 3 is a schematic representation of an exemplary beamline component having a surface in accordance with various aspects of the present disclosure.
Figure 4:
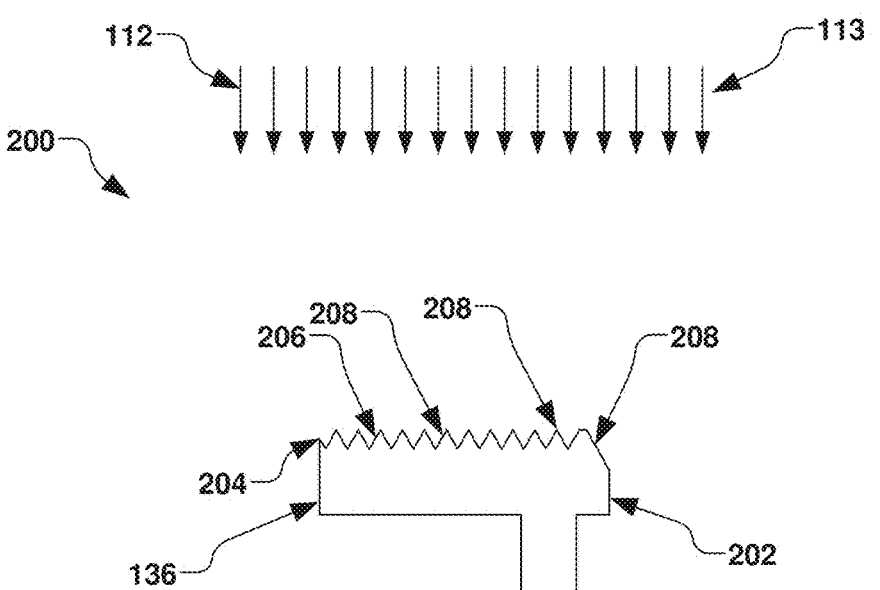
FIG. 4 is a schematic representation of an exemplary beamline component having a surface in accordance with various aspects of the present disclosure.

The present disclosure utilizes a variety of techniques to mitigate issues with particle contamination from the one or more beamline components 136 in the near wafer environment 138. The one or more beamline components 136, in accordance with one particular example, are electrically conductive. The one or more beamline components 136, for example, may comprise an NWE component 200 as illustrated in FIGS. 3-4. The NWE component 200, for example, comprises a substrate 202 (e.g., a graphite substrate), whereby an upstream-facing surface 204 of the NWE component is selectively textured (e.g., mechanically, chemically, or otherwise roughened) to define a textured surface 206. For example, the upstream-facing surface 204 (e.g., a macroscopic surface) is generally normal to the ion beam 112 (e.g., within 10 degrees of normal to the beam path 113) when the upstream-facing surface of the NWE component 200 is considered as a whole.

The textured surface 206, in one example, is produced mechanically by machining of the substrate 202. For example, the textured surface 206 defines one or more features 208 (e.g., one or more V-shaped grooves, ridges, or angled surfaces), wherein each of the one or more features have a depth 210 and a width 212 associated therewith. The depth 210 and width 212, for example, are on the order of millimeters (e.g., a depth of approximately 2 mm to approximately 6 mm). In some examples, the depth 210 and width 212 of the one or more features 208 can be uniform across the textured surface 206, such as illustrated in FIG. 3, while in other examples, the one or more features can have varying depths and widths, as well as a spacing therebetween (not shown). Further, while the one or more features 208 are illustrated as linear structures, the present disclosure further contemplates non-linear or curved structures, and all such structures are contemplated as falling within the scope of the present disclosure.

Figure 5:
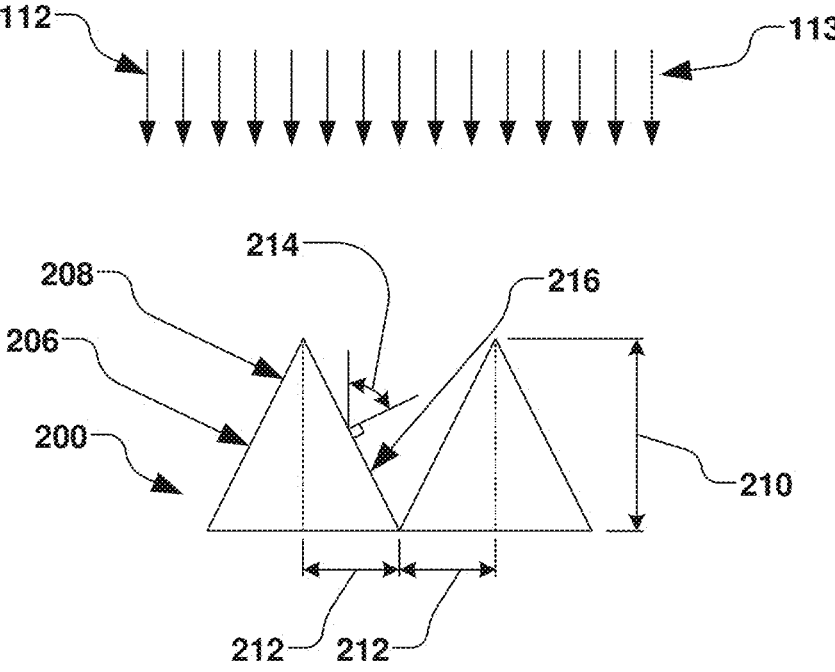
FIG. 5 is an exemplary method for forming a beamline component for an ion implantation system in accordance with various aspects of the present disclosure.

As further shown in FIG. 5, the one or more features 208 of the textured surface 206, for example, further generally define a respective predetermined angle of incidence 214 (also called an incidence angle or pitch) at which the ion beam 112 impinges the NWE component 200. The predetermined angle of incidence 214, for example, is based on the beam path 113 of the ion beam 112 and a feature surface 216 of each of the one or more features 208, whereby the predetermined angle of incidence is measured normal to the feature surface. At least a portion of the upstream-facing surface 204, for example, is at least partially impinged by the ion beam 112, whereby the upstream-facing surface is non-parallel to the beam path 113.

The textured surface 206, in one example, can be produced mechanically by machining of the substrate 202. Further, in another example, one or more regions 218 of the upstream-facing surface 204 of FIG. 3 may be masked or otherwise prevented from being textured (e.g., macroscopically textured). For example, the one or more regions 218 of the upstream-facing surface 204 may mate with other surfaces or apertures, whereby a smooth finish is desirable for such adequate mating of said surfaces. The present disclosure contemplates the substrate 202 of FIGS. 3-4, for example, comprising various grades of graphite, such as T-5 or, CX-80 manufactured by Ibiden Co., LTD. The present disclosure further contemplates selecting the type of graphite for the substrate 202 to give different final porosity and grain size of the graphite.

The present disclosure contemplates application in any upstream-facing surface 204 of any beamline component 136 positioned in the near-wafer environment 138 of FIG. 2. The modification or conversion process of the upstream-facing surface 204 described herein may advantageously enhance the surface to increase longevity properties. A lifetime of the respective beamline component 136 is principally determined by the interval between preventative maintenance activities, which are triggered by the onset of film delamination from, or excessive erosion of, material in the near-wafer environment 138. The present disclosure thus delays onset of delamination by taking advantage of sputtering caused by a predetermined species of ions (e.g., boron or carbon ions) of the ion beam 112 at low energies, thus increasing the lifetime of the component. For example, both boron and carbon have self-sputter yields that are significantly less than unity in the energy range of relevance in ion implantation (e.g., 1-30 keV). The self-sputter yield can be defined as the sputter yield of an ion projectile impinging on a target of the same element, such as the sputter yield of a boron ion impinging on a boron target, or a carbon ion impinging on a carbon target.

The present disclosure thus proposes various systems, apparatuses, and methods for mitigating film depositions by effectively removing films that may have previously formed on the upstream-facing surface 204 of the beamline component 136, and/or generally preventing a formation or build-up of such film depositions in the upstream-facing surface by increasing a predetermined sputter yield through species, energy, and/or geometry changes. The predetermined sputter yield, for example, is defined by a ratio of a number of atoms of the predetermined species sputtered from the upstream-facing surface 204 to a number of ions of the predetermined species impinging the upstream-facing surface. As the predetermined angle of incidence 214 increases, for example, sputtering increases. For sputter yields of greater than one, removal of deposited material is achieved, as well as the general prevention of the initial deposition of the film. Thus, the present disclosure advantageously provides a configuration of one or more features 208 on the upstream-facing surface 204 of the beamline component 136 such that the predetermined sputter yield is greater than one for the predetermined species.

The present disclosure, for example, provides for the removal of deposited boron or carbon films on the upstream-facing surface 204, as well as generally preventing such a deposition, by providing the predetermined angle of incidence 214 of the one more features 208 of the one or more beamline components 136 near the workpiece in order to advantageously optimize or increase the sputter yield of boron ions on boron atoms, as compared to conventional surfaces that are presented generally perpendicular to the beam path 113. Similarly, in another example, the removal of deposited carbon films can be achieved by optimally selecting the predetermined angle of incidence 214 of features 208 of beamline components 136 near the workpiece in order to optimize the sputter yield of carbon ions on carbon atoms.

Figures 6, 7:
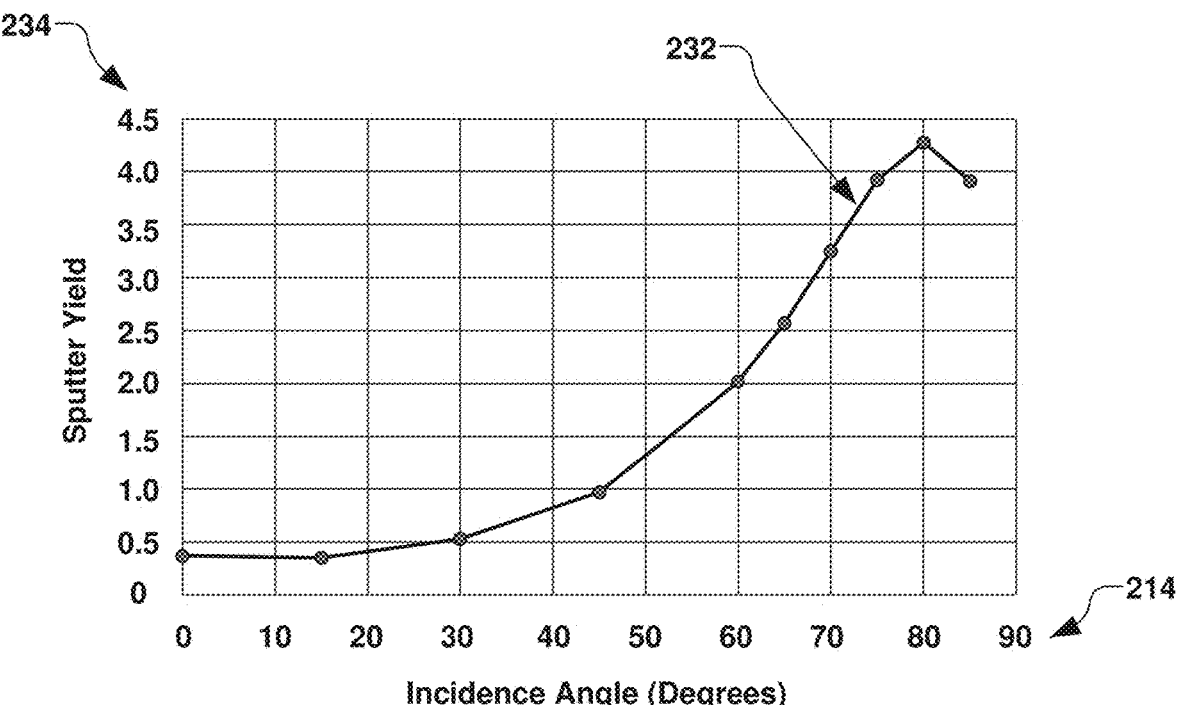
FIG. 6 is a chart illustrating example sputter yields for various species in accordance with various aspects of the present disclosure.
FIG. 7 is a graph illustrating an example sputter yield curve for various boron ions in accordance with various aspects of the present disclosure.

An example sputter yield of boron and carbon ions (e.g., 3 keV ions) on a respective boron film and carbon film at normal incidence angle (e.g., zero degrees) is illustrated in chart 230 of FIG. 6. A sputter yield of 0.37 for the boron ion beam, for example, indicates that more boron atoms will be implanted than will be sputtered away. In such an instance, a film comprising boron atoms will be generally deposited on the surface of the beamline component. However, if the angle of incidence of the impinging ion beam is increased (e.g., from 0 to 45 degrees or greater), as illustrated in curve 232 of FIG. 7, the self-sputter-yield of boron can be increased to greater than one for an example boron or carbon ion beam. The present disclosure thus contemplates, in one example, increasing the angle of incidence 214 of the impinging beam relative to the plane of the feature surface 216 by texturing the upstream-facing surface 204 to provide a greater angle of incidence, such as illustrated in FIG. 4, thus increases the sputter yield 234, as shown in FIG. 7. While the present disclosure contemplates surface modifications to increase the sputter yield to be greater than one, other examples are also contemplated whereby the sputter yield is incrementally increased to any value that is greater than a sputter yield conventionally seen on a planar surface that is normal to the impinging ion beam. In the present example shown by the data in FIG. 7, the predetermined angle of incidence 214 is optimally between approximately 45 degrees and approximately 80 degrees for the boron ion beam. The present disclosure, for example, thus provides geometries of various beamline components (e.g., components near the workpiece) that receive direct ion beam strike at a final energy of the ion beam that is less than an initial energy of the ion beam. For example, surfaces having larger angles increase sputter yield without changing other aspects of tool operation, such as focusing, footprint of the ion implantation system, etc. The present disclosure thus reduces deposition rates in proximity to the workpiece.

Figure 8:
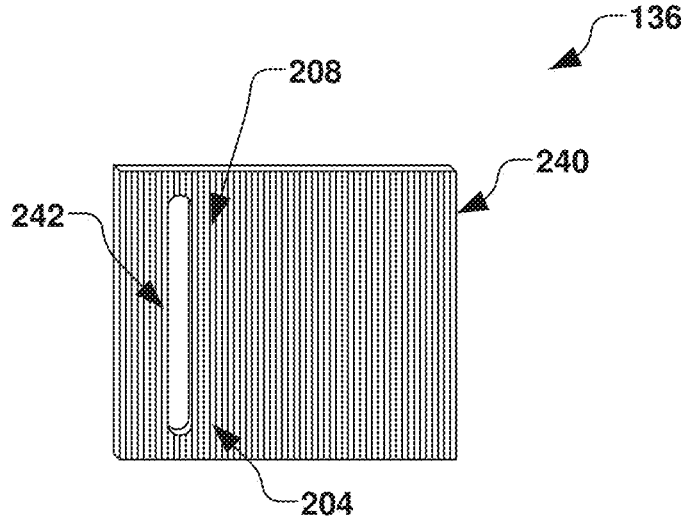
FIG. 8 is a perspective view of an example beamline component comprising an aperture plate having a surface in accordance with various aspects of the present disclosure.
Figure 9:
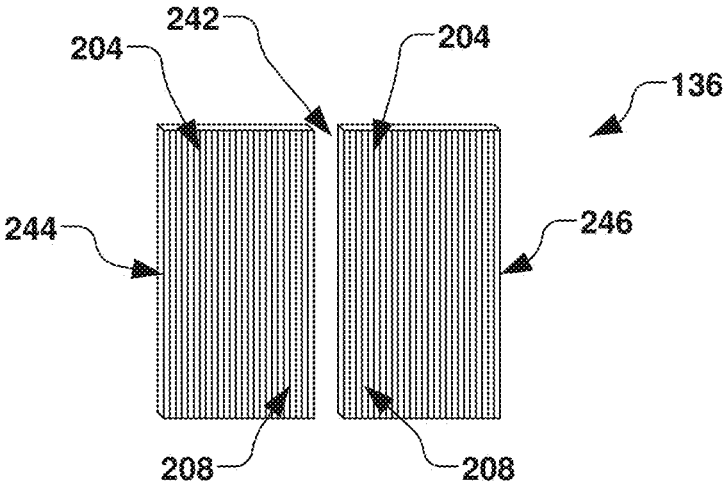
FIG. 9 is a perspective representation of an example beamline component having an aperture having surfaces in accordance with various aspects of the present disclosure.

FIGS. 8-9, for example, illustrate examples of various beamline components 136 where the deposition of boron or carbon is reduced near the workpiece. For example, FIG. 8 illustrates an example front plate 240 that can be implemented in a dose cup or tuning cup wherein the front plate comprises an aperture 242 defined therein. The front plate 240, for example, comprises the plurality of features 208, such as those described above, whereby the plurality of features associated with the upstream-facing surface 204 are at least partially impinged by the ion beam 112 of FIG. 5, whereby the ion beam and is non-parallel to the beam path 113.

FIG. 9, illustrates the beamline component 136 as comprising a first plate 244 and a second plate 246, whereby the aperture 242 is defined between the first plate and second plate, whereby the aperture is configured to pass at least a portion of the ion beam therethrough. In the present example, each of the first plate 244 and second plate 246 comprise the plurality of features 208 that are associated with the upstream-facing surface 204 and are at least partially impinged by the ion beam 112 of FIG. 5. It shall be appreciated that the beamline component 136 can comprise any number of plates associated with any number of E-slits, dose cups, tunnel exits, or beam tuning cups.

The present disclosure further contemplates control of the incident angle based, at least in part, on the ion species being implanted, energy at the location of beam strike, material selection, and sputter yield. The sputter yield, for example, can be considered similar to billiards, where a number of ions ejects or displaces a number of atoms. The sputter yield, for example, can be defined as an average number of atoms that are ejected for each ion imparted to the surface. For example, if one ion causes two atoms to be displaced or ejected, the sputter yield is two. Consistent sputtering at an atomic level with a sputter yield of greater than one will allow for substantially no deposition or build-up of film on the surface. By providing an angle of incidence that is related to the energy, the present disclosure proposes that growth of films can be mitigated and/or inhibited with a sputter yield greater than one. As such, the sputter yield can be varied based on energy, species, substrate, and angle of incidence of the ion beam to the surface of the beamline component. Accordingly, the present disclosure provides a surface having sputter yield that is greater than a predetermined value, such as greater than one. The present disclosure, for example, thus increases a removal rate of deposited films via sputtering, thereby generally inhibiting an overall or net deposition rate and mitigating the growth and/or deposition of the films on one or more beamline components impinged by a low-sputter yield ion beam, such as a boron ion beam.

The present disclosure further appreciates that the energy influences the sputter yield, such as a 3 keV ion beam versus a 25 keV ion beam. At 25 kv, in an extreme example, the curve 232 shown in FIG. 7 would shift upward, whereby at zero angle of incidence, a sputter yield of 1.2 can be achieved. As such, the modified surfaces proposed herein may not be desired in such a high energy environment, and may be deleterious. For example, in general, at higher energies, sputtering is not generally desirable due to the additional material that is ejected. However, the present disclosure appreciates that, at lower energies, such sputtering can cause very minimal problems The present disclosure, for example, provides a geometry on an upstream-facing surface of a beamline component downstream of any final deceleration components, such that the ion beam is at a lower, final energy, and wherein the geometry generally defines a predetermined angle of incidence of the ion beam thereto, and wherein the predetermined angle of incidence provides a predetermined sputter yield.

The present disclosure further appreciates that, based on the sputter yield, the same or similar architecture can be implemented for various ion species, as desired. The present disclosure further appreciates that the invention can be practiced in a so-called "dedicated" ion implantation system used for implanting a sole species. However, the present disclosure further appreciates that various components can be exchanged based on species/energy/process recipe, etc.

The present disclosure further contemplates a non-normal incidence angle of any sort, whereby the sputter yield is utilized as a guide to selecting the angles of incidence. In one example, as opposed to providing the above-mentioned grooves, the present disclosure further contemplates providing an entire beamline component at the non-normal incidence angle. For example, for an ion beam passing through an aperture, the present disclosure contemplates providing the aperture at the incidence angle (e.g., 30, 45, 60 degrees, etc.), such that the surface will not experience deposition due to the sputter yield at the incidence angle. However, in some circumstances, issues such as footprint, focusing concerns, etc. can be limiting in such an example. If space considerations are a concern, a faceted or grooved surface such as shown in FIGS. 2-3 may be more advantageous.

Figure 10:
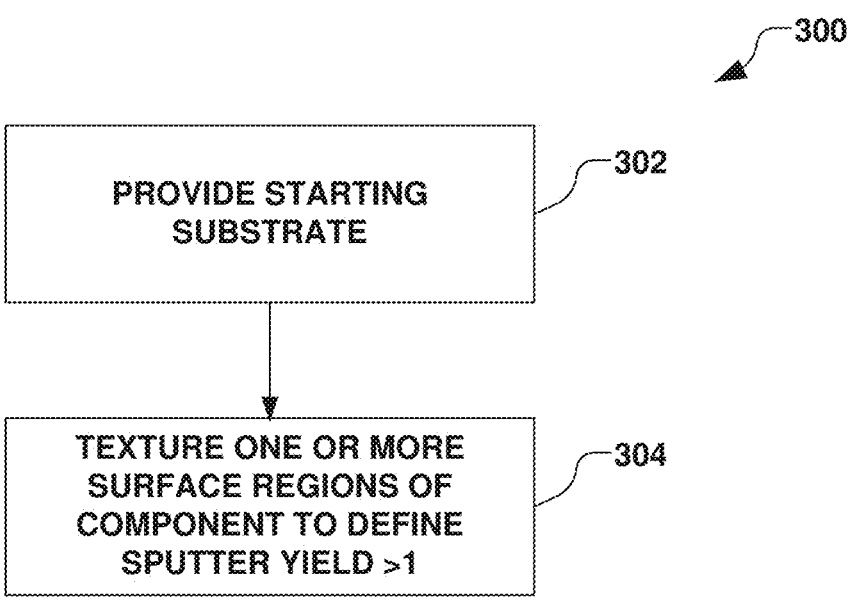
FIG. 10 is a methodology for forming a beamline component in accordance with various aspects of the present disclosure.

In another aspect of the disclosure, FIG. 10 illustrates a method 300 for mitigating a deposition of a film on one or more beamline components of an ion implantation system. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

The method 300 shown in FIG. 10 illustrates providing a starting substrate for one or more beamline components for an ion implantation system in act 302. The starting substrate, for example, may comprise a carbon-based substrate, such as a graphite substrate. In act 304, one or more regions of a surface of the substrate are textured, such as by mechanical, chemical, electrical, or any other texturing processes. A mask or other means may be used to selectively macroscopically texture the surface of the substrate. One example method of texturing graphite uses a specialized end-mill cutter to machine a pattern of grooves across selected surfaces. The grooves, for example, define a predetermined sputter yield of greater than one.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion implantation system, comprising:
an ion source configured to form an ion beam at an initial energy from a predetermined species comprising one of boron or carbon, wherein the ion beam defines a beam path;
a deceleration component positioned along the beam path and configured to decelerate the ion beam to a final energy that is less than the initial energy;
an angular energy filter configured to define a predetermined energy of the ion beam along the beam path, wherein the predetermined energy is less than the initial energy;

a workpiece support configured to support a workpiece along the beam path downstream of the deceleration component; and a beamline component positioned downstream of the deceleration component along the beam path, wherein the beamline component defines an aperture configured to pass at least a portion of the ion beam along the beam path downstream of the beamline component, and wherein the beamline component comprises an upstream-facing surface that is non-parallel to the beam path proximate to the aperture, wherein the upstream-facing surface comprises a plurality of features that are at least partially impinged by the ion beam, and wherein each of the plurality of features comprises a feature surface having a predetermined angle of incidence with respect to the beam path to define a predetermined sputter yield of the ion beam at the final energy, and wherein the predetermined sputter yield generally mitigates a deposition of the predetermined species on the beamline component.

2. The ion implantation system of claim 1, wherein the predetermined sputter yield is defined by a ratio of a number of atoms of the predetermined species sputtered from the upstream-facing surface to a number of ions of the predetermined species impinging the upstream-facing surface, and wherein the predetermined sputter yield is greater than one.

3. The ion implantation system of claim 1, wherein the predetermined angle of incidence is between approximately 45 degrees and approximately 80 degrees.

4. The ion implantation system of claim 1, wherein the plurality of features define a plurality of V-shaped grooves.

5. The ion implantation system of claim 4, wherein each of the plurality of V-shaped grooves has a predetermined depth when viewed along the beam path.

6. The ion implantation system of claim 5, wherein the predetermined depth is between approximately 2 mm and approximately 6 mm.

7. The ion implantation system of claim 1, wherein the final energy is approximately 3 KeV.

8. The ion implantation system of claim 1, wherein the beamline component is comprised of carbon.

9. The ion implantation system of claim 1, wherein the beamline component comprises one or more of an E-slit, a front plate associated with a dose cup, a tunnel exit, and a beam tuning cup.

10. An ion implantation system, comprising:

an ion source configured to define an ion beam at an initial energy from a predetermined species comprising boron or carbon along a beam path;

an angular energy filter configured to define a predetermined energy of the ion beam along the beam path, wherein the predetermined energy is less than the initial energy; and a beamline component positioned downstream of the angular energy filter along the beam path, wherein the beamline component has an upstream-facing surface that is at least partially impinged by the ion beam and is non-parallel to the beam path, wherein the upstream-facing surface comprises a plurality of features configured to define a sputter yield of greater than one, wherein the sputter yield is defined by a ratio of a number of atoms of the predetermined species that are sputtered from the upstream-facing surface to a number of ions of the predetermined species impinging the upstream-facing surface, and wherein each of the plurality of features respectively comprises a feature surface defining a predetermined angle of incidence between the feature surface and the ion beam when measured along the beam path, wherein the predetermined angle of incidence is less than 90 degrees.

11. The ion implantation system of claim 10, wherein the predetermined angle of incidence is between approximately 45 degrees and approximately 80 degrees.

12. The ion implantation system of claim 10, wherein the plurality of features comprise a plurality of V-shaped grooves defined in the upstream-facing surface of the beamline component.

13. The ion implantation system of claim 12, wherein each of the plurality of V-shaped grooves has a respective predetermined depth when viewed along the beam path, wherein the respective predetermined depth is between approximately 2 mm and approximately 6 mm.

14. The ion implantation system of claim 10, wherein the predetermined energy is approximately 3 KeV.

15. The ion implantation system of claim 10, wherein the beamline component defines an aperture configured to pass at least a portion of the ion beam therethrough.

16. The ion implantation system of claim 15, wherein the beamline component comprises one or more of an E-slit, a front plate associated with a dose cup, a tunnel exit, and a beam tuning cup.

17. An ion implantation system, comprising:

a source species comprising one of boron or carbon;

an ion source configured to form an ion beam along a beam path at an initial energy from the source species;

an angular energy filter positioned downstream of the ion source along the beam path and configured to define a predetermined energy of the ion beam, wherein the predetermined energy is less than the initial energy; and a beamline component positioned downstream of the angular energy filter along the beam path, wherein the beamline component has an upstream-facing surface that is at least partially impinged by the ion beam and is non-parallel to the beam path, wherein the upstream-facing surface comprises a plurality of features configured to define a sputter yield of greater than one, wherein the sputter yield is defined by a ratio of a number of atoms of the source species that are sputtered from the upstream-facing surface to a number of ions of the source species impinging the upstream-facing surface, and wherein each of the plurality of features respectively comprises a feature surface defining a predetermined angle of incidence between the feature surface and ion beam when measured along the beam path, wherein the predetermined angle of incidence is less than 90 degrees.

18. The ion implantation system of claim 17, wherein the beamline component comprises an aperture configured to pass at least a portion of the ion beam therethrough.

19. The ion implantation system of claim 17, wherein the predetermined angle of incidence is greater than approximately 45 degrees.

20. The ion implantation system of claim 17, wherein the plurality of features comprise a plurality of V-shaped grooves defined in the upstream-facing surface of the beamline component, and wherein each of the plurality of V-shaped grooves has a respective predetermined depth when viewed along the beam path, wherein the respective predetermined depth is between approximately 2 mm and approximately 6 mm.

* * * * *